United States Patent
Baba et al.

(10) Patent No.: US 7,134,909 B2
(45) Date of Patent: Nov. 14, 2006

(54) CONNECTOR CIRCUIT BOARD

(75) Inventors: Masayuki Baba, Kawasaki (JP); Shuichi Kameyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/968,978

(22) Filed: Oct. 21, 2004

(65) Prior Publication Data
US 2006/0025013 A1 Feb. 2, 2006

(30) Foreign Application Priority Data
Jul. 28, 2004 (JP) ............................. 2004-219804

(51) Int. Cl.
*H01R 13/73* (2006.01)
*G01R 31/02* (2006.01)

(52) U.S. Cl. ...................... 439/557; 439/700

(58) Field of Classification Search ............... 439/557, 439/700
See application file for complete search history.

(56) References Cited

U.S. PATENT DOCUMENTS

| | | | |
|---|---|---|---|
| 4,795,977 A * | 1/1989 | Frost et al. .................. 324/537 |
| 5,257,948 A * | 11/1993 | Peterson ....................... 439/571 |
| 5,366,380 A * | 11/1994 | Reymond ....................... 439/66 |
| 6,402,567 B1 * | 6/2002 | Zhu ............................. 439/700 |
| 6,447,343 B1 * | 9/2002 | Zhang et al. ................. 439/700 |
| 6,758,682 B1 * | 7/2004 | Kosmala ....................... 439/66 |
| 6,814,626 B1 * | 11/2004 | Wen-Yao ....................... 439/700 |
| 2006/0025013 A1 * | 2/2006 | Baba et al. ................... 439/557 |

FOREIGN PATENT DOCUMENTS

JP     2-68982     3/1990

* cited by examiner

*Primary Examiner*—James R. Harvey
(74) *Attorney, Agent, or Firm*—Armstrong, Kratz, Quintos, Hanson & Brooks, LLP (57) ABSTRACT

A connector has conducting pins projecting from a connector body, and fixing pin extending substantially in parallel with the conducting pins. The fixing pins are longer than the conducting pins. The fixing pins are constructed such that they can be inserted in corresponding fixing holes of a printed circuit board when the connector is attached to the printed circuit board. The fixing pins are locked in the fixing holes to secure the electrical connection between the conducting pins and corresponding electrode pads and the mechanical connection between the connector and the printed circuit board.

8 Claims, 8 Drawing Sheets

CONNECTOR CIRCUIT BOARD

BACKGROUND OF THE INVENTION

1. Field of the Invention

The present invention relates to a connector.

2. Description of the Related Art

In a test of a printed circuit board, a plurality of probes connected to a test device are arranged, in the same pattern as the pattern of electrode pads on the printed circuit board, and are brought into contact with the respective electrode pads. Spring probes are used as the testing probes. The spring probes are arranged in a jig, so that the spring probes are pressed against the electrode pads on the printed circuit board. This method makes it necessary to develop and manufacture jigs in line with printed circuit boards, and the cost of development and manufacture of a jig arises for each type of printed circuit board. Moreover, the jig bearing the spring probes has a relatively complex structure and a mechanism for supporting the printed circuit board is needed.

As a method of connecting a printed circuit board to a test device, a method of mounting a connector is used. In this method, a connector mounting design is needed so that the connector can be mounted on the printed circuit board. The expenses of parts of a connector and the labor and cost for mounting the connector arise.

An example in which a connector is mounted on a printed circuit board is disclosed in Japanese Unexamined Patent Publication No. 2002-268911, for example. The terminal pins of the connector are inserted into through holes in the printed circuit board.

SUMMARY OF THE INVENTION

An object of the present invention is to provide a connector which can connect a test device to a printed circuit board at a relatively low cost.

A connector in accordance with the present invention comprises a connector body, at least one conducting pin projecting from the connector body, and at least one fixing pin extending substantially in parallel with the conducting pin. The fixing pin is longer than the conducting pin.

The fixing pin has a structure suitable for fixing the fixing pin to a printed circuit board. For example, the fixing pin has a tapered structure and is thinner towards the distal end thereof. Otherwise, the fixing pin comprises at least one elastically deformable member, the member having a hook portion.

Moreover, at least one fixing pin is preferably structured to restrict the direction in which the connector is moved for attachment. Moreover, the at least one fixing pin preferably comprises two fixing pins.

According to the foregoing structure, the fixing pin of the connector is inserted into a fixing hole in a printed circuit board. When the connector is pressed against the printed circuit board, the conducting pin of the connector is brought into contact with an electrode pad on the printed circuit board. The fixing pin of the connector is fitted into the fixing hole formed in the printed circuit board when being inserted into the fixing hole. Consequently, the connector is electrically connected to the printed circuit board, and joined to the printed circuit board. Namely, the connector is autonomously joined to the printed circuit board. Consequently, another jig need not be employed but the connector is easily attached to the printed circuit board and electrically connected thereto.

According to the present invention, a connector can be relatively easily and reliably electrically connected to a printed circuit board by touching conducting pins to electrode pads. Moreover, when a fixing pin is fitted into a fixing hole, the electrical connection of the conducting pins to the electrode pads is ensured. If the connector is connected to a test device, the test device and the printed circuit board are connected to each other at a relatively low cost.

DESCRIPTION OF THE PREFERRED EMBODIMENT

Figure 1:
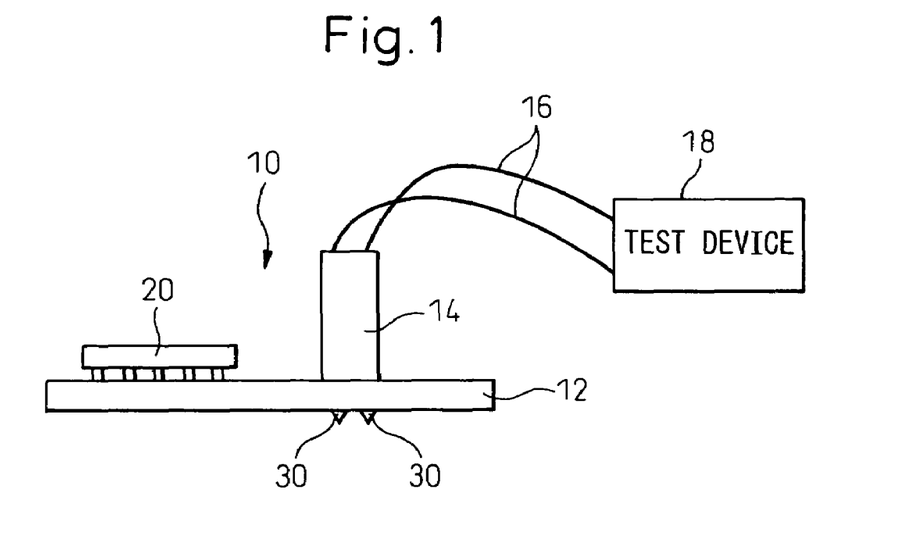
FIG. 1 is a view showing an example in which a connector in accordance with an embodiment of the present invention is connected to a printed circuit board and a test device.
Figure 2:
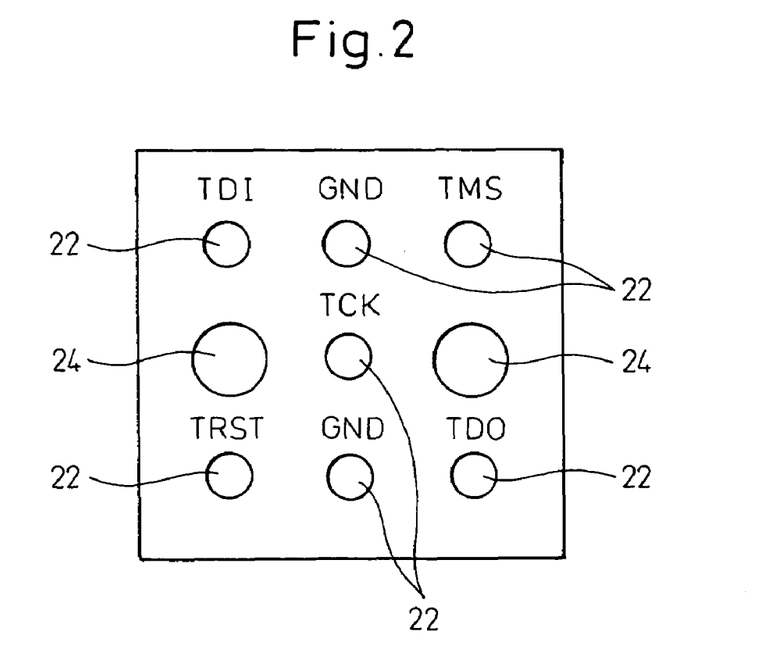
FIG. 2 is a view showing a region or part of the printed circuit board shown in FIG. 1 in which a plurality of electrode pads and a plurality of fixing holes are arranged.

An embodiment of the present invention will be described with reference to the drawings below. FIG. 1 shows an example in which a connector according to the embodiment of the present invention is connected to a printed circuit board and a test device. FIG. 2 shows a region or part of the printed circuit board shown in FIG. 1 in which a plurality of electrode pads and a plurality of fixing holes are arranged. The region shown in FIG. 2 is equivalent to a region on the printed circuit board to which the connector shown in FIG. 1 is attached. A description will be made, by way of an example of an electrical connection, of an object to be tested, to a test device for in-circuit emulation, of a printed circuit board. However, the present invention is not limited to such an example.

In FIGS. 1 and 2, an attached/assembled structure 10 comprises a printed circuit board 12 and a connector 14. The connector 14 is constructed to be attached to the printed circuit board 12, and to be detached therefrom. The connector 14 is connected to a test device 18 by cables 16.

The printed circuit board 12 comprises a semiconductor device 20, at least one electrode pad (land) 22, and at least one fixing hole 24. In the illustrated embodiment, a plurality of electrode pads 22 and a plurality of fixing holes 24 are formed. The fixing hole 24 is a through hole. The printed circuit board 12 has internal circuits and external connection terminals that are not shown. The semiconductor device 20 is connected to the electrode pads 22 via the internal circuits. Other electrical components may be mounted on the printed circuit board 12.

The electrode pads 22 are provided according to signals prescribed by the IEEE 1149.1 test bus (called a JTAG bus). JTAG testing signals include signals TDI, TDO, TMS, TCK, and TRST. The electrode pads 22 and fixing holes 24 are collectively arranged in one region. Preferably, the number of electrode pads 22 is five or more. Furthermore, a grounding electrode pad 22 is preferably included.

In FIG. 2, two fixing holes 24 and seven electrode pads 22 are arranged in three columns and three rows. Regarding a row or a column where the fixing hole 24 is positioned, at least one fixing hole 24 and at least one electrode pad 22 are aligned in one line in one region.

Figure 3:
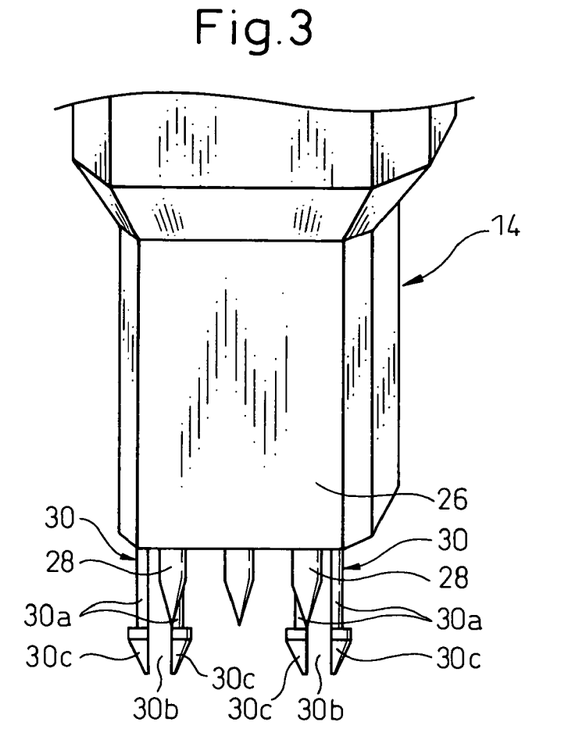
FIG. 3 is a perspective view showing the connector.
Figure 4:
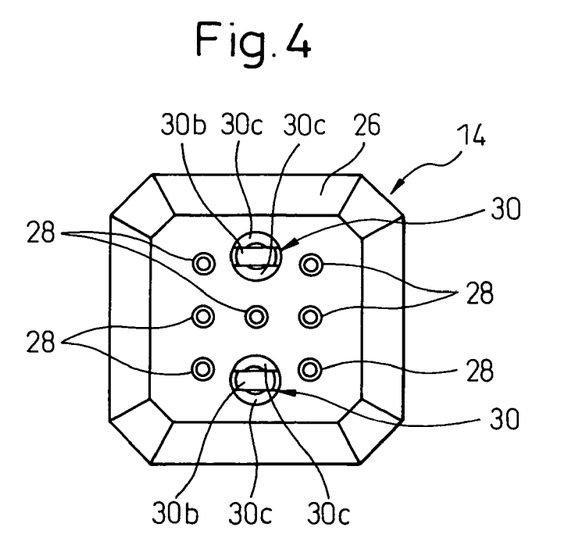
FIG. 4 is a bottom view of the connector shown in FIG. 3.

FIG. 3 is a perspective view showing the connector 14, and FIG. 4 is a bottom view of the connector 14 shown in FIG. 3. The connector 14 comprises a connector body 26, seven conducting pins 28 projecting downward from the bottom of the connector body 26, and two fixing pins 30 extending substantially in parallel with the conducting pins 28. The fixing pins 30 are longer than the conducting pins 28. The conducting pins 28 are brought into contact with the electrode pads 22 on the printed circuit board 12, and act as probes for testing. Furthermore, the cables 16 shown in FIG. 1 extend from the top of the connector 14. The conducting pins 28 are electrically connected to the cables 16.

The seven conducting pins 28 and two fixing pins 30 are, similarly to the seven electrode pads 22 and two fixing holes 24 shown in FIG. 2, collectively arranged in one region, at a positional relationship therebetween identical to the positional relationship between the conducting pins 28 and two fixing pins 30. When the connector 14 is attached to the printed circuit board 12, the two fixing pins 30 are inserted into the two fixing holes 24, and the seven conducting pins 28 are brought into contact with the seven electrode pads 22. The fixing pins 30 are longer than the conducting pins 28, the fixing pins 30 are inserted into the fixing holes 24 before the conducting pins 28 contact the electrode pads 22. The fixing pins 30 serve as guides during attachment of the connector 14 to the printed circuit board 12.

Each fixing pin 30 has a structure suitable for fixing to the printed circuit board 12. The fixing pin 30 comprises at least one elastically deformable member that may be structured to have a hook portion. In the illustrated embodiment, the fixing pin 30 has a split structure and is formed with a pair of elongated members 30a that are elastically deformable to move toward and away from each other. A gap 30b is created between the pair of elongated members 30a. When the elongated members 30 are elastically deformed toward and away from each other, the gap 30b gets smaller or larger. Each elongated member 30a has a substantially semicircular cross section. The elongated member 30a has an arrowhead-like hook portion 30c at a distal end thereof.

Figure 5:
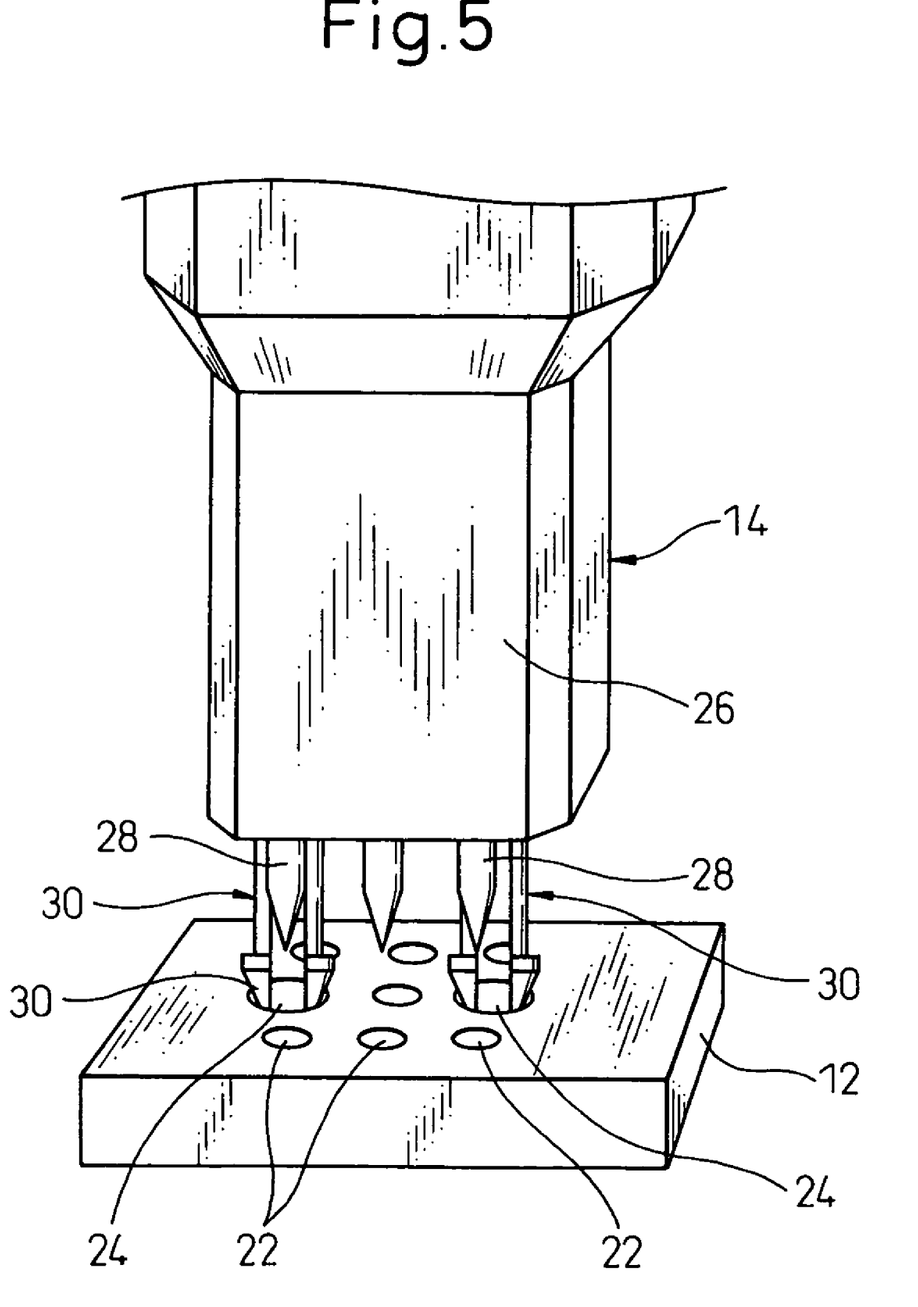
FIG. 5 is a perspective view showing the connector in an initial stage of its attachment to the printed circuit board.
Figure 6:
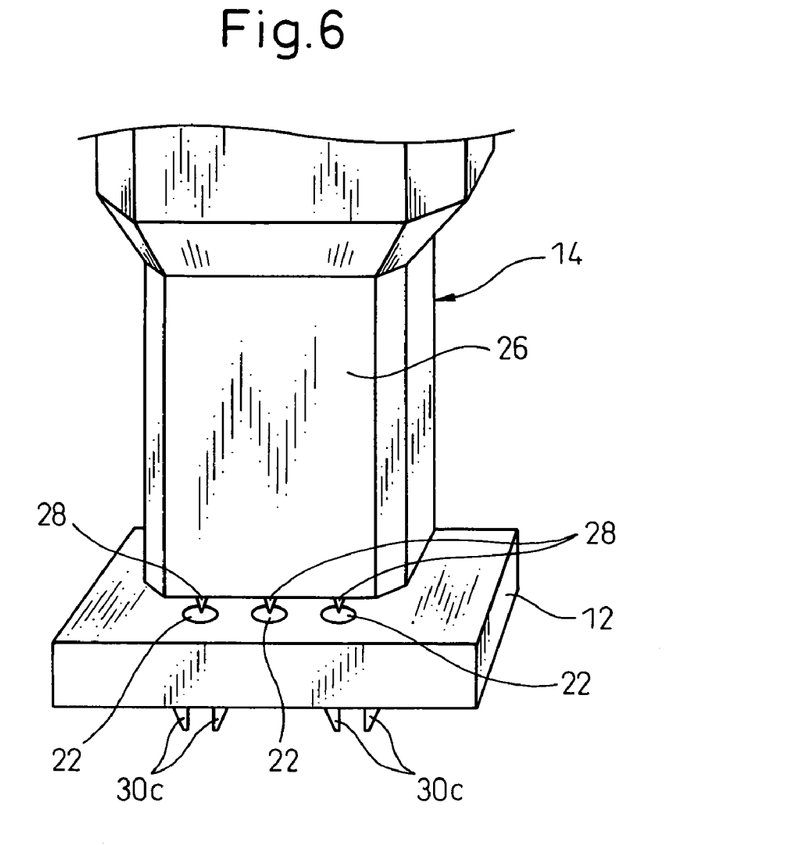
FIG. 6 is a view showing the connector attached to the printed circuit board.

FIG. 5 is a perspective view showing the connector 14 in an initial stage of its attachment to the printed circuit board 12. FIG. 6 is a perspective view showing the connector 14 attached to the printed circuit board 12. Upon attaching the connector 14 to the printed circuit board 12, the fixing pins 30 of the connector 14 are inserted into the fixing holes 24 of the printed circuit board 12 and the connector 14 is pressed against the printed circuit board 12, with the result that the conducting pins 28 of the connector 14 contact the electrode pads on the printed circuit board 12.

The distance between the external surfaces of the pair of elongated members 30a of the fixing pin 30 is larger than the inner diameter of the fixing hole 24 of the printed circuit board 12. The lower tapered parts of the distal hook portions 30c of the pair of elongated members 30a are first inserted into the fixing hole 24, and, as the fixing pin 30 is pushed into the fixing hole 24, the gap 30b between the pair of elongated members 30a gets smaller. Once the hook portions 30c pass through the lower edge of the fixing hole 24 (the bottom of the printed circuit board 12), the pair of elongated members 30a are opened, so that the elongated members 30a contact the internal surface of the fixing hole 24 and the hook portions 30c are engaged with the bottom of the printed circuit board 12. Thus, the fixing pin 30 is substantially immovably locked in the fixing hole 24.

In this state, the conducting pins 28 of the connector 14 contact the electrode pads 22 on the printed circuit board 12, and the connector 14 is electrically connected to the printed circuit board 12. Moreover, the connector 14 is mechanically joined to the printed circuit board 12. Thus, the fixing pins 30 secure the electrical contact of the conducting pins 28 with the electrode pads 22 and the mechanical connection of the connector 14 to the printed circuit board 12. In other words, the connector 14 is autonomously joined to the printed circuit board 12. Thus, the connector 14 is easily attached to the printed circuit board 12 and electrically connected thereto, without using any other jig.

Figure 7:
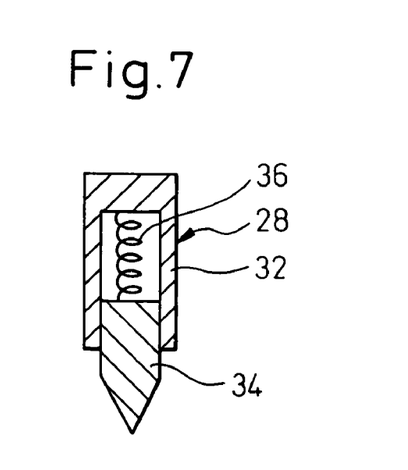
FIG. 7 is a view showing an example of the conducting pin formed as a spring probe.

FIG. 7 shows an example in which the conducting pin 28 is formed as a spring probe. The conducting pin 28 comprises a metallic cylindrical member 32 disposed in the connector body 26, a contact member 34 movably fitted in the metallic cylindrical member 32, and a spring 36 interposed between the metallic cylindrical member 32 and contact member 34. When the conducting pin 28 is pressed against the electrode pad 22, the probe 34 contacts the electrode pad 22 under the force exerted by the spring 36. Thus, the conducting pin 28 reliably contacts the electrode pad 22.

After the connector 14 is coupled to the printed circuit board 12, a desired test or the like is carried out. After the test is completed, the connector 14 is detached from the printed circuit board 12.

In order to detach the connector 14 from the printed circuit board 12, the connector 14 is pulled out of the printed circuit board 12 with a certain force. This causes the pair of elongated members 30a of the fixing pin 30 to close and the hook portions 30c are disengaged from the bottom of the printed circuit board 12. Thus, the fixing pins 30 are unlocked and the connector 14 can be detached from the printed circuit board 12.

In this case, preferably, the hook portions 30c of the fixing pins 30 should be devised so that when the connector is in use, the conducting pins 28 are in contact with the electrode pads 22 and the hook portions 30c are locked so as not to come off from the fixing holes 24 due to the force exerted by the springs 36; and when the connector is detached from the printed circuit board 12, the hook portions 30c come off from the fixing holes 24 by applying force, which is greater than pressure required for maintaining the contact of the conducting pins 28 to the electrode pads 22, to the fixing pins 30.

Figure 8:
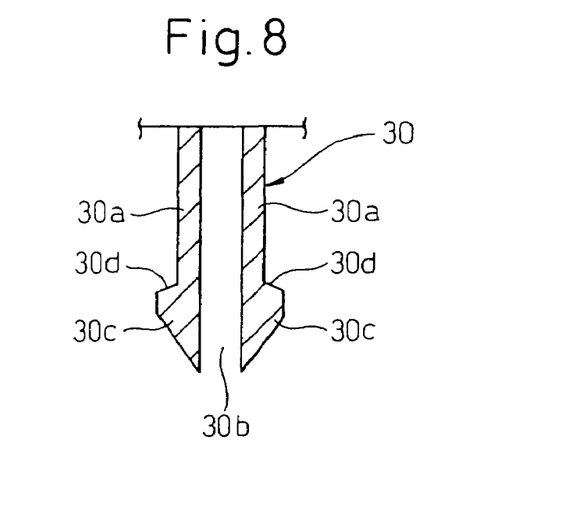
FIG. 8 is a view showing an example of hook portions of the fixing pin.

For example, as shown in FIG. 8, a part 30d of the hook portion 30c of the fixing pin 30 which is engaged with the bottom of the printed circuit board 12 is slightly rounded or tilted relative to a plane parallel to the bottom of the printed circuit board 12.

Figure 9:
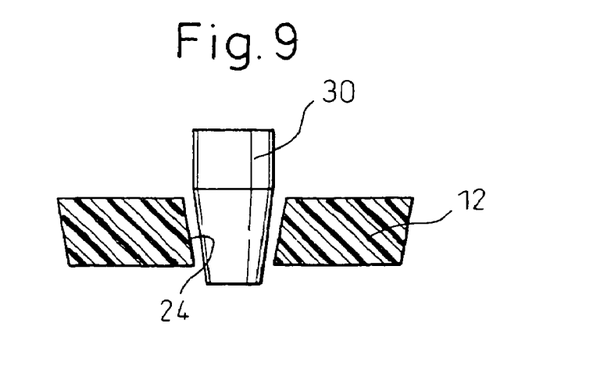
FIG. 9 is a view showing another example of the fixing pin.

FIG. 9 shows another example of the fixing pin 30. The fixing pin 30 is shaped to be thinner towards the distal end thereof and be thick in the middle thereof. When the fixing pin 30 is inserted into the fixing hole 24, the fixing pin 30 stops halfway, and friction arises between the fixing pin 30 and the fixing hole 24. The fixing pin 30 is held immovable in the fixing hole 24 due to the frictional force. Thus, when the connector is in use, the fixing pins 30 will not come off from the fixing holes 24 due to the force exerted by the springs 36, and when the connector 14 is detached from the printed circuit board 12, the fixing pins 30 come off from the fixing holes 24 by applying a force that is greater than the force required for maintaining the contact of the conducting pins 28 to the electrode pads 22.

The fixing pins 30 and the fixing holes 24 serve as a guiding mechanism during attachment of the connector 14 to the printed circuit board 12, realize the mechanical connection of the connector 14 to the printed circuit board 12, and maintain the electrical contact of the conducting pins 28 with the electrode pads 22.

Figure 10:
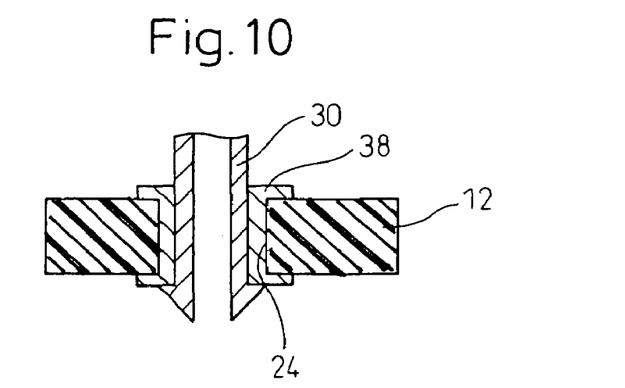
FIG. 10 is a view showing a further example of the fixing pin and the fixing hole.

FIG. 10 shows another example of the fixing pin 30 and the fixing hole 24. In this example, the fixing hole 24 is formed as a through hole for use in attaining electrical connection. Namely, a conductive film 38 is formed on the wall of the fixing hole 24, and the fixing pin 30 is made of a conducting material. Consequently, the fixing pin 30 is electrically connected to the conducting film 38. Thus, the fixing pin 30 has both the aforesaid capability of the fixing pin 30 and the capability of the conducting pin 28.

Figure 11:
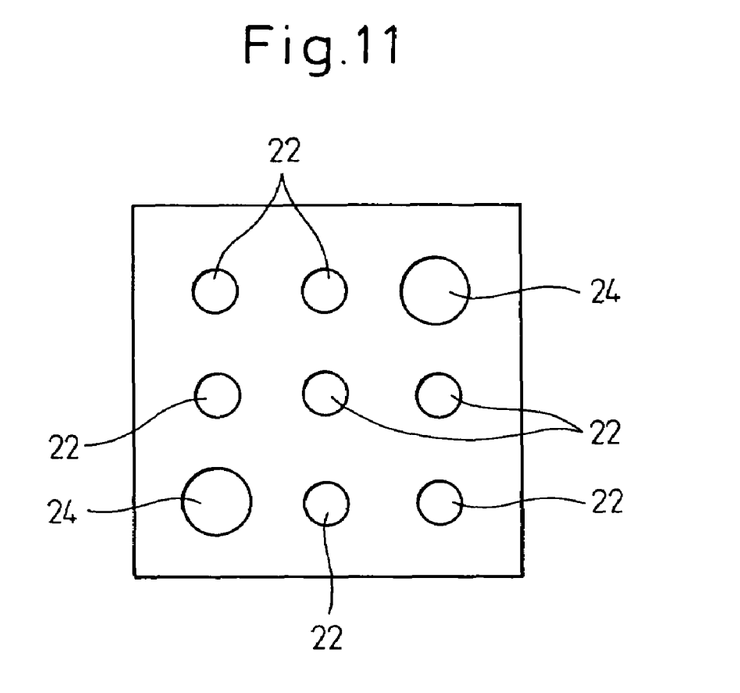
FIG. 11 is a view showing a further example of the arrangement of electrode pads and fixing holes.

FIG. 11 to FIG. 17 show examples of a structure for restricting the attachment direction of the connector 14. FIG. 11 shows another example of the arrangement of the electrode pads 22 and the fixing holes 24. In FIG. 2, the two fixing holes 24 are arranged in the second row symmetrically to each other. In FIG. 11, the two fixing holes 24 are arranged diagonally symmetrically to each other. The arrangement of the two fixing pins 30 is changed accordingly.

Figure 12:
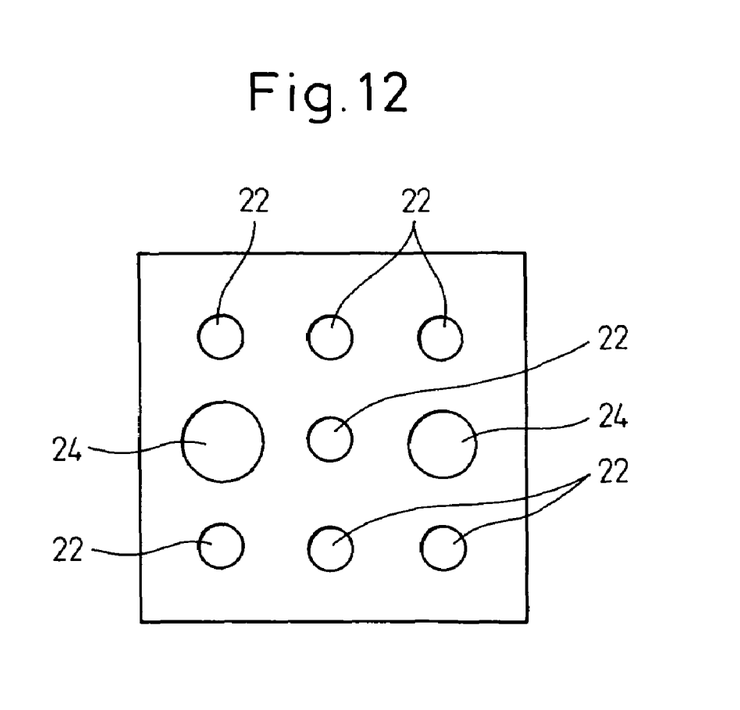
FIG. 12 is a view showing an example of a plurality of fixing holes whose shapes are different from each other.

FIG. 12 shows an example in which the plurality of fixing holes 24 have different shapes. Namely, the sizes of the two fixing holes 24 are different from each other. The sizes of the two fixing pins 30 are changed accordingly.

Figure 13:
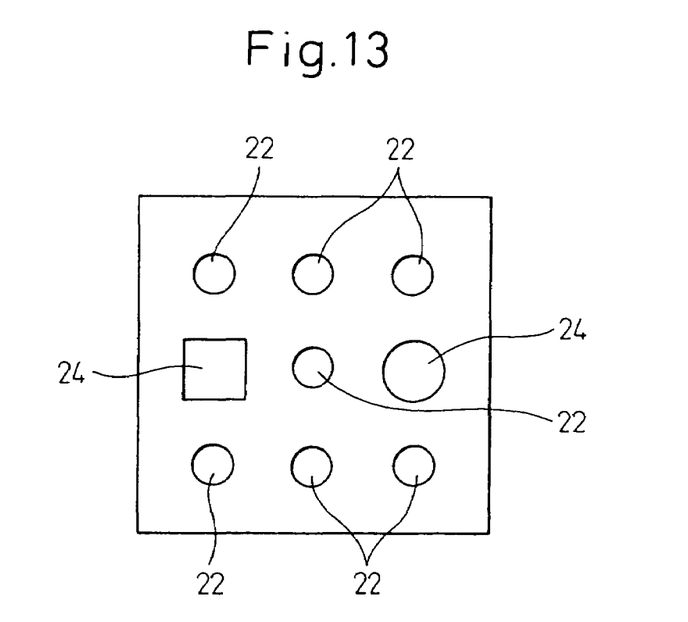
FIG. 13 is a view showing an example of a plurality of fixing holes whose shapes are different from each other.

FIG. 13 shows an example in which the plurality of fixing holes 24 have different shapes. Namely, one of the fixing holes 24 is square and the other fixing hole 24 is round. The shapes of the two fixing pins 30 are changed accordingly.

Figure 14:
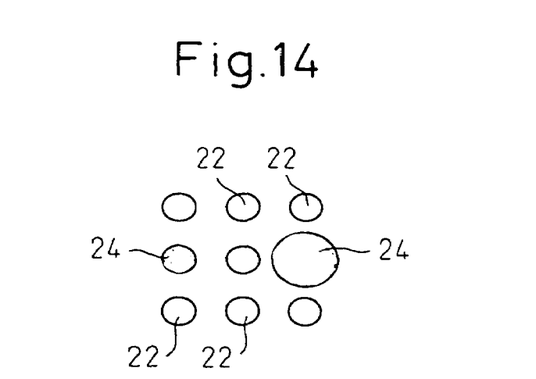
FIG. 14 is a view showing an example of a plurality of fixing holes whose shapes are different from each other.

FIG. 14 shows an example in which the plurality of fixing holes 24 have different shapes. Namely, the two fixing holes 24 are round and have different sizes. The shapes of the two fixing pins 30 are changed accordingly. Incidentally, the shape of the fixing holes 24 and the fixing pins 30 is not limited to a round or a square.

By varying the respective shapes of the plurality of fixing holes 24 and the plurality of fixing pins 30, incorrect insertion can be prevented. The conducting pins 28 will be accurately brought into contact with the associated electrode pads 22.

Figure 15:
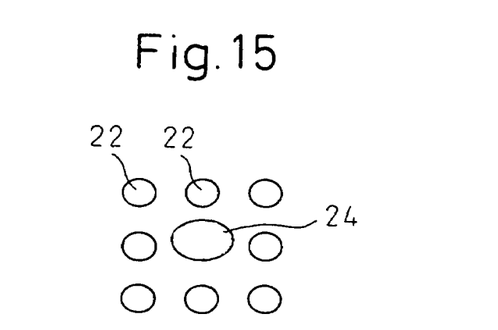
FIG. 15 is a view showing a further example of the position and shape of the fixing hole.

FIG. 15 shows another example of the arrangement of the electrode pads 22 and the fixing hole 24. In FIG. 2, the two fixing holes 24 are arranged. In FIG. 15, one elliptic fixing hole 24 is disposed in the center. Accordingly, one fixing pin 30 is formed elliptically.

Figure 16:
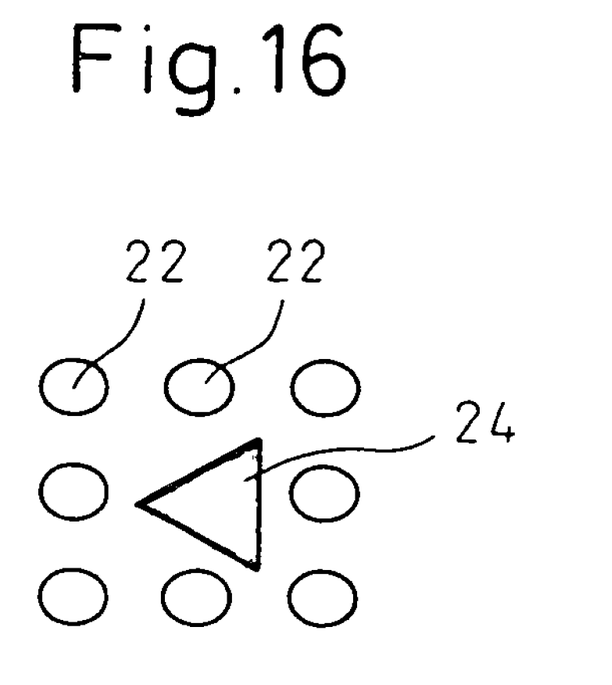
FIG. 16 is a view showing a further example of the position and shape of the fixing hole.
Figure 17:
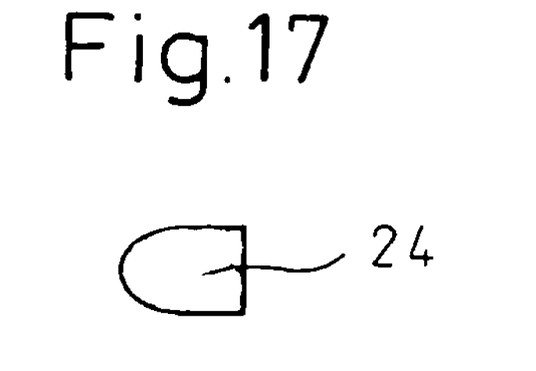
FIG. 17 is a view showing a further example of the shape of the fixing hole.

FIG. 16 shows an example in which the shape of the fixing hole 24 is changed. One triangular fixing hole 24 is disposed in the center. Accordingly, one fixing pin 30 is formed triangularly. In FIG. 17, one fixing hole 24 is shaped like a bullet. In this case, the fixing pin 30 is shaped like a bullet accordingly.

As mentioned above, one fixing hole 24 and one fixing pin 30 are used to fix the connector 14 to the printed circuit board 12. By varying the shapes of the fixing hole 24 and the fixing pin 30, incorrect insertion is prevented. The conducting pins 28 are accurately brought into contact with the associated electrode pads 22.

As described so far, according to the present invention, a connector includes conducting pins serving as probes, and fixing pins that secure the contact of the conducting pins to electrode pads and maintain mechanical connection. Thus, an extra jig need not be included for connecting a printed circuit board to a test device. Therefore, the cost of development or manufacture of such a jig can be minimized. Moreover, the connector is autonomously connected to the printed circuit board, and reliable electrical connection can be achieved. When the connector is connected to the test device for use, a test or the like can be performed on the printed circuit board (or a semiconductor device mounted on the printed circuit board). Aside from the electrode pads for testing, only the fixing holes are added to the printed circuit board, and the cost of manufacture of the printed circuit board will therefore be hardly increased. As the fixing holes and the conducting pins are collectively arranged in one region, an extra area need not be preserved. This expands the freedom in arranging the conducting pins.

The invention claimed is:

1. A connector arranged to connect a test device to a printed circuit board, the printed circuit board having at least one electro pad and at least one fixing hole, comprising:

a connector body;

at least one conducting pin projecting from said connector body, for contact with said at least one electro pad of said printed circuit board; and at least one fixing pin, having at its distal end a withdrawing tapered portion, extending substantially in parallel with said at least one conducting pin;

wherein said at least one fixing pin is longer than said conducting pin and is arranged to be inserted into said at least one fixing hole and the at least one conducting pin contacts said at least one electro pad, and said at least one fixing pin is detachable from said fixing hole, by withdrawing of said distal end, to permit detachment of said test device from said printed circuit board;

wherein said conducting pin has a metallic cylindrical member disposed in said connector body, a contact member movably fitted in said metallic cylindrical member, and a spring interposed between said metallic cylindrical member and said contact member;

wherein said withdrawing tapered portion is locked so as not to come off from said fixing hole due to a force exerted by said spring.

2. The connector according to claim 1, wherein said at least one fixing pin comprises at least one elastically deformable member, said member having a hook portion.

3. The connector according to claim 1, wherein said at least one fixing pin has a tapered shape to become thinner towards the distal end thereof.

4. The connector according to claim 1, wherein said at least one fixing pin has a structure to restrict an attaching direction of said connector.

5. The connector according to claim 1, wherein said at least one fixing pin comprises two fixing pins.

6. The connector according to claim 1, wherein said at least one conducting pin comprises a plurality of conducting pins.

7. The connector according to claim 5, wherein said at least one conducting pin comprises a plurality of conducting pins.

8. The connector according to claim 7, wherein said two fixing pins are arranged in a region where said conducting pins are arranged.

* * * * *